US011139396B2

(12) United States Patent
Karda et al.

(10) Patent No.: US 11,139,396 B2
(45) Date of Patent: Oct. 5, 2021

(54) DEVICES INCLUDING VERTICAL TRANSISTORS, AND RELATED METHODS

(71) Applicant: Micron Technology, Inc., Boise, ID (US)

(72) Inventors: Kamal M. Karda, Boise, ID (US); Durai Vishak Nirmal Ramaswamy, Boise, ID (US); Haitao Liu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 89 days.

(21) Appl. No.: 16/596,090

(22) Filed: Oct. 8, 2019

(65) Prior Publication Data

US 2020/0111916 A1 Apr. 9, 2020

Related U.S. Application Data

(60) Provisional application No. 62/743,078, filed on Oct. 9, 2018.

(51) Int. Cl.
*H01L 29/78* (2006.01)
*H01L 29/786* (2006.01)
(Continued)

(52) U.S. Cl.
CPC ...... *H01L 29/7827* (2013.01); *H01L 21/0262* (2013.01); *H01L 29/66969* (2013.01);
(Continued)

(58) Field of Classification Search
CPC ........ H01L 21/02104; H01L 21/02365; H01L 21/02518; H01L 21/02554; H01L 21/02565; H01L 21/0262; H01L 21/8232; H01L 21/823406; H01L 21/823437; H01L 21/823807; H01L 21/823828; H01L 29/66; H01L 29/66007; H01L 29/66409; H01L 29/66477; H01L 29/66666; H01L 29/66742; H01L 29/66787;
(Continued)

(56) References Cited

U.S. PATENT DOCUMENTS 6,815,805 B2 11/2004 Weimer
8,299,516 B2 10/2012 Weng et al.
(Continued)

FOREIGN PATENT DOCUMENTS

KR 10-1368191 B1 2/2014
WO 2018/063308 A1 4/2018

OTHER PUBLICATIONS

International Search Report from International Application No. PCT/US2019/055226, dated Jan. 22, 2020, 3 pages.
(Continued)

*Primary Examiner* — Cheung Lee
(74) *Attorney, Agent, or Firm* — TraskBritt

(57) ABSTRACT

A device comprises a first conductive line and a vertical transistor over the first conductive line. The vertical transistor comprises a gate electrode, a gate dielectric material overlying sides of the gate electrode, and a channel region on sides of the gate dielectric material, the gate dielectric material located between the channel region and the gate electrode. The device further comprises a second conductive line overlying a conductive contact of the at least one vertical transistor. Related devices and methods of forming the devices are also disclosed.

31 Claims, 9 Drawing Sheets

(51) Int. Cl.
*H01L 21/02* (2006.01)
*H01L 29/66* (2006.01)

(52) U.S. Cl.
CPC .... *H01L 29/7869* (2013.01); *H01L 29/78642* (2013.01); *H01L 29/78696* (2013.01)

(58) Field of Classification Search
CPC . H01L 29/66969; H01L 29/68; H01L 29/772; H01L 29/78; H01L 29/7827; H01L 29/786; H01L 29/78642; H01L 29/78651; H01L 29/7869; H01L 29/78696
See application file for complete search history.

(56) References Cited

U.S. PATENT DOCUMENTS

| | | |
|---|---|---|
| 8,895,979 B2 | 11/2014 | Chang et al. |
| 9,082,793 B1 | 7/2015 | Ahmed |
| 9,246,013 B2 | 1/2016 | Ahmed |
| 9,397,145 B1 | 7/2016 | Sills et al. |
| 9,773,888 B2 | 9/2017 | Pulugurtha et al. |
| 2006/0278910 A1 | 12/2006 | Forbes |
| 2012/0153371 A1 | 6/2012 | Chen et al. |
| 2012/0273874 A1 | 11/2012 | Wu et al. |
| 2016/0027804 A1 | 1/2016 | Li et al. |
| 2016/0079385 A1 | 3/2016 | Ellinger et al. |
| 2016/0359029 A1 | 12/2016 | Zeng et al. |
| 2017/0141230 A1 | 5/2017 | Toshiba |
| 2018/0090679 A1 | 3/2018 | Sills et al. |

OTHER PUBLICATIONS

International Written Opinion from International Application No. PCT/US2019/055226, dated Jan. 22, 2020, 6 pages.
Taiwanese Office Action for Application No. 108136375, dated Sep. 30, 2020, 17 pages.
Billah et al. TCAD Simulation of Dual-Gate a-IGZO TFTs With Source and Drain Offsets, IEEE Electron Device Letters, vol. 37, No. 11, (Nov. 2016), pp. 1442-1445.
Liu et al., Highly Flexible Electronics from Scalable Vertical Thin Film Transistors, Nano Letters, vol. 14, (2014), pp. 1413-1418.
Petti et al., Flexible Quasi-Vertical In—Ga—Zn—O Thin-Film Transistor With 300-nm Channel Length, vol. 36, No. 5, (May 2015), pp. 475-477.
Yoon et al., Effects of Deposition Temperature on the Device Characteristics of Oxide Thin-Film Transistors Using In—Ga—Zn—O Active Channels Prepared by Atomic-Layer, Applied Materials &Interfaces, vol. 9, (2017), pp. 22676-22684.
Zheng et al., All-Sputtered, Flexible, Bottom-Gate IGZO/Al2O3 Bi-Layer Thin Film Transistors on PEN Fabricated by a Fully Room Temperature Process, Journals of Materials Chemistry C, vol. 5, (2017), pp. 7043-7050.

DEVICES INCLUDING VERTICAL TRANSISTORS, AND RELATED METHODS

CROSS-REFERENCE TO RELATED APPLICATION

This application claims the benefit under 35 U.S.C. § 119(e) of U.S. Provisional Patent Application Ser. No. 62/743,078, filed Oct. 9, 2018, and entitled "SEMICONDUCTOR DEVICES INCLUDING VERTICAL TRANSISTORS, AND RELATED METHODS," the disclosure of which is hereby incorporated herein in its entirety by this reference.

TECHNICAL FIELD

Embodiments disclosed herein relate to semiconductor devices including vertical transistors, and to related methods. More particularly, embodiments of the disclosure relate to devices including vertical transistors, the vertical transistors including a gate electrode surrounded by a gate dielectric material, and having channel regions disposed on sides of the gate dielectric material, the gate electrode located between the channel regions, and to related methods.

BACKGROUND

Fabrication of semiconductor devices includes forming transistors which may be used to access, for example, a storage component of a memory cell of the semiconductor device. The transistors include a channel region comprising a semiconductor material formulated and configured to conduct a current responsive to application of a threshold voltage and hinder the flow of current in the absence of the threshold voltage.

In semiconductor devices including vertical memory cells, the transistors associated with the vertical memory cells may be vertical. Forming such transistors includes stacking materials that will eventually form the transistors of the vertical memory cell, the materials including source and drain contacts, channel regions, and gate electrode materials. The materials of the stack are patterned to form pillars including the stack of materials.

The channel regions of the vertical transistors include a semiconductor material. Forming the pillars including the semiconductor material of the channel regions may include patterning the semiconductor material, such as by exposing the semiconductor material to one or more etch chemistries. However, some semiconductor materials conventionally used in vertical transistors exhibit a high off current ($I_{off}$), which may affect charge retention, the flow of current, and other electrical properties of adjacent vertical transistors. For example, a high off current of a vertical transistor may affect (e.g., disturb) the condition of an adjacent vertical transistor when the adjacent vertical transistor is accessed.

Replacement of conventional semiconductor materials in the channel region has proven difficult. For example, some semiconductor materials are sensitive to exposure to hydrogen and degrade responsive to exposure to hydrogen-containing materials. Accordingly, exposing such semiconductor materials to the one or more etch chemistries including a hydrogen-containing material may undesirably negatively affect the electrical and material properties of the semiconductor material. Exposing the semiconductor material to etch chemistries, such as hydrogen-containing plasmas, may affect the electrical properties of the semiconductor material, affecting the flow of current through a channel material formed from the semiconductor material, and ultimately affecting performance of the associated transistor. In addition, such semiconductor materials may exhibit a low threshold voltage ($V_t$) even when the transistor is scaled and includes a double gate electrode (i.e., two gate electrodes disposed around a central channel region) or a relatively large gate electrode and, therefore, require a large negative voltage when the transistor is in the off state.

In addition, conventional processes of forming a memory cell often include performing a hydrogen annealing process wherein one or more features of the memory cell being fabricated is exposed to hydrogen while being annealed at low temperatures (e.g., less than 450° C.). However, during the hydrogen annealing process, hydrogen can diffuse into the channel region of the access device of the memory cell, degrading the performance and/or reliability of the resultant memory device.

DETAILED DESCRIPTION

Figure 1A:
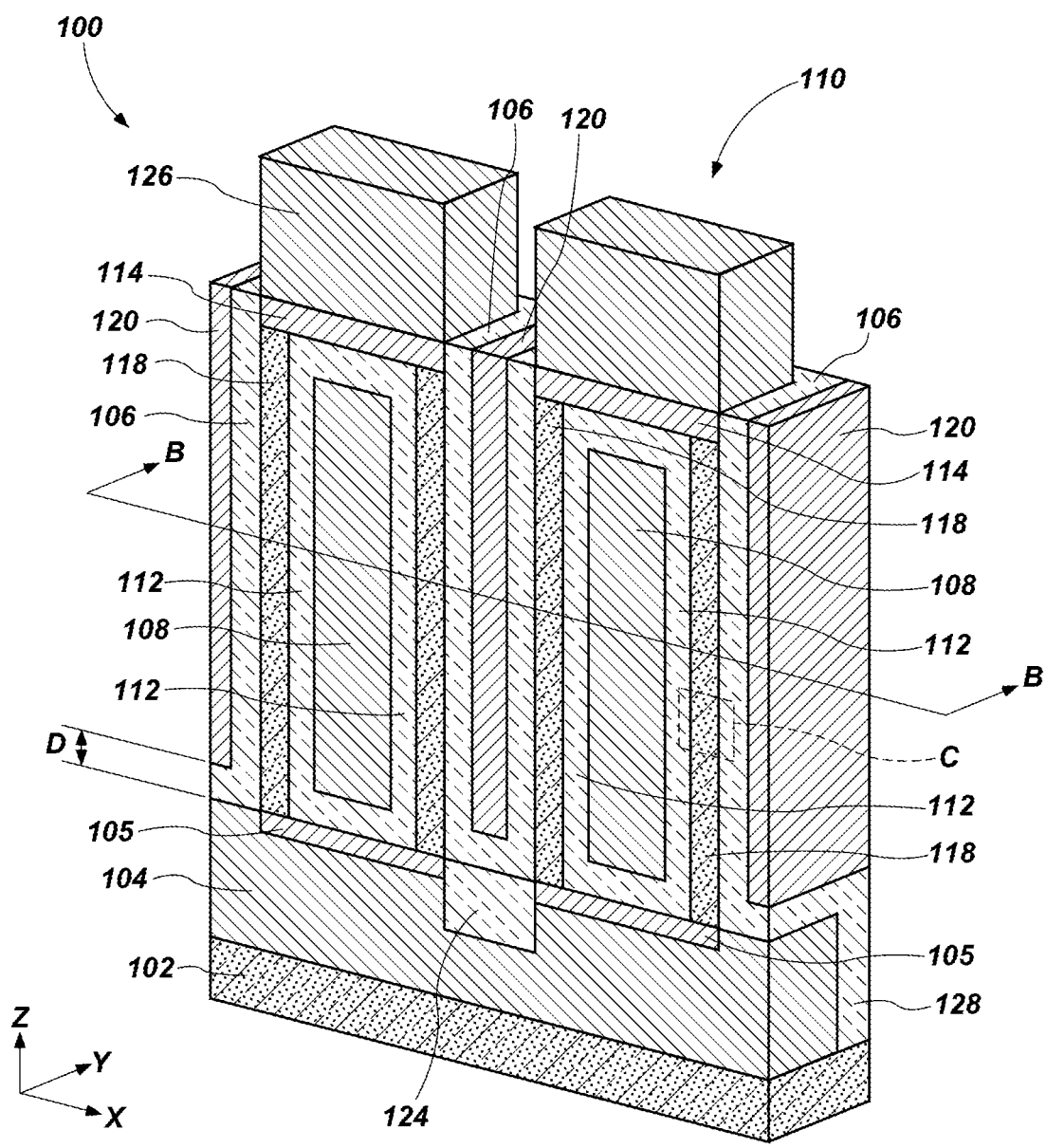
FIG. 1A is a simplified cutaway perspective view of a semiconductor device including vertical transistors, in accordance with embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a vertical transistor, a semiconductor device including vertical transistors, or a complete description of a process flow for fabricating such a vertical transistor or a semiconductor device. The structures described below do not form complete semiconductor device structures. Only those process acts and structures necessary to understand the embodiments described herein are described in detail below. Additional acts to form a complete semiconductor device or vertical transistor may be performed by conventional techniques.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "electrically conductive material" means and includes a material including tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

According to embodiments described herein, a semiconductor device comprises an array of vertical transistors. The vertical transistors include vertically oriented channel regions located on sides of a gate electrode. In other words, the gate electrode of a vertical transistor may be located between the vertically oriented channel regions of the vertical transistor. A gate dielectric material is located between each of the channel regions and the gate electrode. In some embodiments, the gate electrode is located at a laterally central location of the vertical transistor. Since the gate electrode is located centrally to the channel regions, the gate electrode has a relatively larger thickness compared to transistors having a channel region located central to the vertical transistor for the same pitch of vertical transistors. Since the gate electrode has a larger thickness compared to conventional vertical transistors having the same pitch, the gate electrode may exhibit a reduced resistivity. The vertical transistor may, therefore, exhibit a reduced RC (e.g., product of resistance of the word lines and capacitance of the word lines (e.g., word line to word line capacitance)) value, which may be inversely proportional to the switching speed of the vertical transistor. In some embodiments, the vertical transistor exhibits an RC value that is about 1.8 times smaller than the RC value of a conventional vertical transistor having the same pitch as the vertical transistors disclosed herein. Accordingly, the vertical transistor may exhibit a switching speed about 1.8 times faster than a switching speed of a conventional vertical transistor. In some embodiments, an electrically conductive material may be located between adjacent vertical transistors and may be configured to be electrically biased. Biasing the electrically conductive material may reduce or prevent so-called "word line disturb" wherein the gate electrode (e.g., word line) of one vertical transistor affects the gate electrode of an adjacent vertical transistor when a voltage is applied to the word line of the vertical transistor. In addition, the voltage applied to the electrically conductive material may affect the threshold voltage of adjacent vertical memory cells.

Figure 1B:
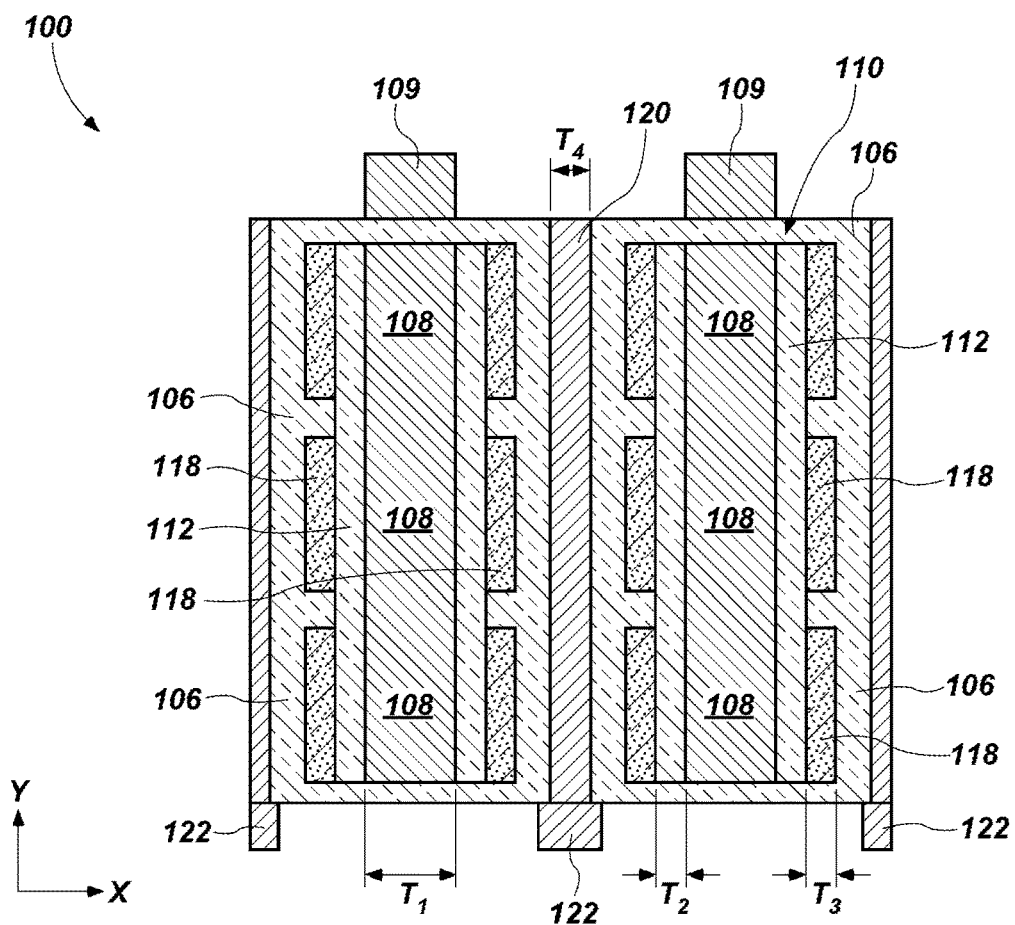
FIG. 1B is a simplified top cross-sectional view of the semiconductor device of FIG. 1A taken along section line B-B of FIG. 1A.

FIG. 1A is a simplified cutaway perspective view of a semiconductor device 100, in accordance with embodiments of the disclosure. FIG. 1B is a simplified planar cross-sectional view of the semiconductor device 100 of FIG. 1A taken along section line B-B of FIG. 1A. The semiconductor device 100 includes vertical transistors 110 over a substrate 102. The substrate 102 may be a base material or a construction upon which additional materials are formed. The substrate 102 may be a semiconductor substrate, a base semiconductor layer on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped.

With reference to FIG. 1A and FIG. 1B, the vertical transistors 110 may be arranged in rows (e.g., extending in the x-direction) and columns (e.g., extending in the y-direction). In some embodiments, the rows may be substantially perpendicular to the columns. However, the disclosure is not so limited and the vertical transistors 110 may be arranged in a pattern different than that illustrated in FIG. 1A and FIG. 1B. Although FIG. 1B illustrates only 6 vertical transistors, the disclosure is not so limited. The semiconductor device 100 may include, for example, any number of vertical transistors 110, such as more than about 1,000 vertical transistors 110, more than about 10,000 vertical transistors 110, or more than about 100,000 vertical transistors 110.

As shown in FIG. 1A, vertical transistors 110 may include first conductive lines 104 over at least a portion of the substrate 102. In some embodiments, the first conductive lines 104 may be arranged in rows extending in a first direction (e.g., the x-direction) along the substrate 102. In some such embodiments, each of the first conductive lines 104 may be in electrical communication with vertical transistors 110 of a row of vertical transistors 110. In some embodiments, the first conductive lines 104 may be referred to herein as a digit line. In other embodiments, the first conductive lines 104 may be referred to as a source line.

The first conductive lines 104 may include tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the first conductive lines 104 comprise tungsten. In other embodiments, the first conductive lines 104 comprise ruthenium.

The first conductive lines 104 of adjacent rows may be electrically isolated from each other, such as through an electrically insulative material 128, which may comprise, for example, phosphosilicate glass, borosilicate glass, borophosphosilicate glass (BPSG), fluorosilicate glass, silicon dioxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), high-k dielectric materials (e.g., aluminum oxide ($Al_2O_3$), tantalum oxide ($Ta_2O_5$), zirconium oxide ($ZrO_2$), hafnium oxide ($HfO_2$), lanthanum oxide ($La_2O_3$), titanium oxide ($TiO_2$)), another material, or combinations thereof. In some embodiments, the electrically insulative material 128 comprises silicon dioxide.

The vertical transistors 110 may include a lower conductive contact 105, which may comprise, for example, one of a source contact or a drain contact of the vertical transistors 110. The lower conductive contact 105 of a vertical transistor 110 may be in electrical communication with a respective first conductive line 104. The lower conductive contact 105 may include an electrically conductive material. In some embodiments, the lower conductive contact 105 comprises the same material as the first conductive lines 104.

In some embodiments, an electrically insulative material 124 may electrically isolate the lower conductive contact 105 of the vertical transistors 110 from the lower conductive contact 105 of adjacent vertical transistors 110. The electrically insulative material 124 may comprise, for example, phosphosilicate glass, borosilicate glass, borophosphosilicate glass (BPSG), fluorosilicate glass, silicon dioxide, a nitride material, (e.g., silicon nitride ($Si_3N_4$)), an oxynitride (e.g., silicon oxynitride), another dielectric material, a dielectric carbon nitride material (e.g., silicon carbon nitride (SiCN)), a dielectric carboxynitride material (e.g., silicon carboxynitride (SiOCN)), high-k dielectric materials (e.g., aluminum oxide ($Al_2O_3$), tantalum oxide ($Ta_2O_5$), zirconium oxide ($ZrO_2$), hafnium oxide ($HfO_2$), lanthanum oxide ($La_2O_3$), titanium oxide ($TiO_2$)), another material, or combinations thereof. In other embodiments, the semiconductor device 100 may not include the electrically insulative material 124 and the adjacent vertical transistors 110 may be sufficiently electrically isolated by, for example, an electrically insulative material 106, as will be described herein.

Each vertical transistor 110 may include a gate electrode 108 surrounded on at least some sides thereof by a gate dielectric material 112. The gate electrode 108 may also be referred to herein as a word line of the vertical transistor 110. With reference to FIG. 1B, the gate electrodes 108 may extend as lines extending in, for example, the y-direction.

The gate electrode 108 may include an electrically conductive material such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

A thickness $T_1$ of the gate electrode 108 may be between about 30 Å and about 200 Å, such as between about 30 Å and about 50 Å, between about 50 Å and about 100 Å, between about 100 Å and about 150 Å, or between about 150 Å and about 200 Å.

The semiconductor device 100 may include electrically conductive contacts 109 (FIG. 1B) in electrical communication with the gate electrodes 108. In some embodiments, each column of the vertical transistors 110 (FIG. 1A) may include at least one electrically conductive contact 109 in electrical communication with the gate electrodes 108 of its corresponding column. The electrically conductive contacts 109 may comprise an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the electrically conductive contacts 109 comprise the same material as the gate electrodes 108. In other embodiments, the electrically conductive contacts 109 comprise a material different form the material of the gate electrodes 108.

In some embodiments, the electrically conductive contacts 109 are in electrical communication with a voltage source configured to provide a suitable voltage (e.g., a bias voltage) to the gate electrodes 108 associated with the electrically conductive contacts 109.

The gate dielectric material 112 may be disposed around at least some sides of the gate electrode 108. The gate dielectric material 112 may extend along and adjacent to the gate electrode 108. In some embodiments, the gate dielectric material 112 extends in lines adjacent to the gate electrode 108. The gate dielectric material 112 may be located on at least one side of the gate electrode 108. In some embodiments, the gate dielectric material 112 may be located adjacent to the gate electrode 108 at opposing sides thereof. In some embodiments, the gate dielectric material 112 may underlie and overlie the gate electrode 108. In some embodiments, and with reference to FIG. 1A and FIG. 1B, the gate dielectric material 112 may be located above and below the gate electrode 108 (FIG. 1A) and on at least two lateral sides (e.g., the sides in the x-direction) of the gate electrode 108. As will be described herein, in some embodiments, an electrically insulative material 106, which may comprise the same material as the gate dielectric material 112, may be disposed around at least two other lateral sides (e.g., the sides in the y-direction) of the gate electrode 108. In some such embodiments, the gate electrode 108 may be substantially surrounded on all sides thereof (e.g., above, below, left, right, front, back, etc.) with a dielectric material.

The gate dielectric material 112 may comprise one or more electrically insulative materials, such as, for example, phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), another material, or combinations thereof. In some embodiments, the gate dielectric material 112 comprises silicon dioxide.

The gate dielectric material 112 may have a thickness $T_2$ between about 20 Å and about 100 Å, such as between about 20 Å and about 40 Å, between about 40 Å and about 60 Å, between about 60 Å and about 80 Å, or between about 80 Å and about 100 Å. In some embodiments, a distance between an upper surface of the gate electrode 108 and an upper surface of channel regions 118 may be tailored by adjusting the thickness of the gate dielectric material 112.

The vertical transistors 110 may further include an upper conductive contact 114 overlying the gate electrode 108 and the gate dielectric material 112. In some embodiments, the upper conductive contact 114 may include, for example, one of a source contact or a drain contact (while the lower conductive contact 105 comprises the other of the source contact or the drain contact) of the vertical transistors 110. The upper conductive contact 114 may include an electrically conductive material. In some embodiments, the upper conductive contact 114 comprises the same material as the lower conductive contact 105. In other embodiments, the upper conductive contact 114 comprises a different material as the lower conductive contact 105.

The upper conductive contact 114 may be in electrical communication with a second conductive line 126. FIG. 1A illustrates only a portion of the second conductive lines 126, but it will be understood that in at least some embodiments, the second electrically conductive lines 126 extend in a second direction (e.g., the y-direction), different from the first direction in which the first electrically conductive lines 104 extend. The second electrically conductive lines 126 may comprise an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the second electrically conductive lines 126 comprise tungsten or ruthenium. In some embodiments, the second electrically conductive lines 126 comprise the same materials as the first electrically conductive lines 104. In other embodiments, the second conductive lines 126 comprise a different material than the first conductive lines 104.

A channel region 118 may be located adjacent to (e.g., overlie sidewalls of) the gate dielectric material 112. The channel region 118 may comprise a semiconductor material formulated and configured to exhibit electrical conductivity responsive to application of a suitable voltage (e.g., a threshold voltage $V_t$) to the vertical transistor 110 (e.g., between the gate electrode 108 and the source region (e.g., the conductive line 104)). In some embodiments, the channel region 118 may directly contact the lower conductive contact 105 and extend along sidewalls of the gate dielectric material 112 to contact the upper conductive contact 114. Accordingly, the channel regions 118 may directly contact each of the lower conductive contact 105 and the upper conductive contact 114. In some such embodiments, the channel regions 118 may be in electrical communication with each of a source region and a drain region of the vertical transistor 110 associated with the channel regions 118.

In some embodiments, each vertical transistor 110 may include two distinct channel regions 118 and a single gate electrode 108. The channel regions 118 may surround the gate electrode 108 and may be located adjacent to the gate electrode 108, such as at, for example, sides of the gate electrode 108. In other words, the gate electrode 108 may be positioned centrally (e.g., laterally centrally) between the two channel regions 118 of the vertical transistor 110. Although FIG. 1A and FIG. 1B are illustrated and described as including two channel regions 118, the disclosure is not so limited. In other embodiments, the vertical transistors 110 include only one channel region 118.

The channel region 118 may comprise a material formulated to conduct current responsive to application of a suitable voltage (e.g., a threshold voltage, a set bias voltage, a read bias voltage) to the vertical transistor 110. The channel region 118 may comprise a semiconductive material having a larger bandgap than polycrystalline silicon, such as a bandgap greater than about 1.65 electronvolts (eV), and may be referred to herein as a so-called "large bandgap material." For example, the channel region 118 may comprise an oxide semiconductor material, such as one or more of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($ZnxO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), indium tungsten oxide (IWO), combinations thereof, and other similar materials. In some embodiments, the channel region 118 comprises IGZO. In some embodiments, the channel region 118 may have an In:Ga:Zn:O ratio of 1:1:1:4; may have an $In_2O_3$:$Ga_2O_3$:ZnO ratio of 2:2:1, or may be represented by the formula $InGaO_3(ZnO)_5$. In additional embodiments, the channel region 118 comprises IGZO and IGSO. The channel region 118 may comprise a ternary oxide including atoms of two different elements as well as atoms of oxygen. In other embodiments, the channel region 118 comprises a quaternary oxide including atoms of three different elements and atoms of oxygen. As will be described herein, in some embodiments, the channel region 118 may include a composite structure including one or more discrete portions of one or more of the materials described above.

In some embodiments, gallium may constitute from about 20 atomic percent to about 60 atomic percent, such as from about 35 atomic percent to about 55 atomic percent, of the channel region 118, based on the non-oxide elements (i.e., based on the other elements of the channel region 118 (i.e., not including oxygen atoms)). Zinc may constitute from about 20 atomic percent to about 60 atomic percent, such as from about 20 atomic percent to about 40 atomic percent, of the channel region 118, based on non-oxide elements of the channel region 118. Indium may constitute from about 20 atomic percent to about 60 atomic percent, such as from about 20 atomic percent to about 40 atomic percent, of the channel region 118, based on the non-oxide elements of the channel region 118. However, the disclosure is not so limited and the channel region 118 may have a different composition than that described above.

The channel region 118 may have a thickness $T_3$ between about 20 Å and about 200 Å, such as between about 20 Å and about 50 Å, between about 50 Å and about 100 Å, between about 100 Å and about 150 Å, or between about 150 Å and about 200 Å.

Figure 1C:
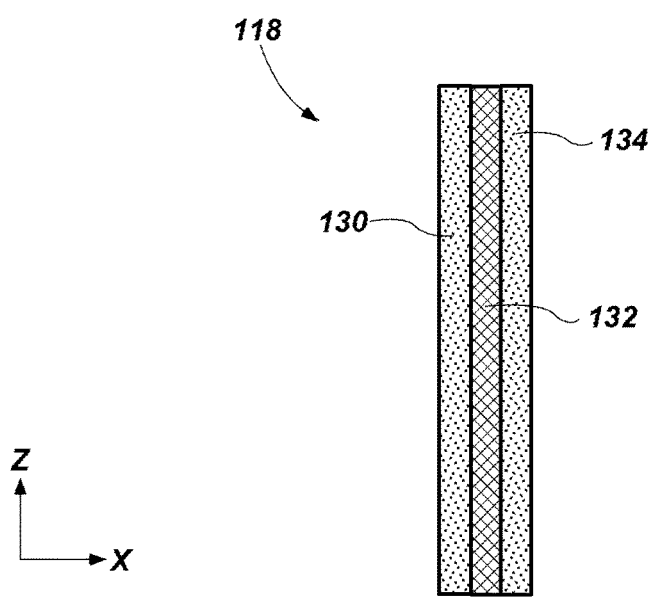
FIG. 1C is a simplified cross-sectional view of a channel region, in accordance with embodiments of the disclosure.

In some embodiments, the channel region 118 comprises a single material having a substantially uniform composition. In other embodiments, the channel region 118 may comprise a composite structure including more than one type of semiconductor material (e.g., oxide semiconductor material). FIG. 1C is a simplified cross-sectional view of a portion of one of the channel regions 118, showing, for example, the portion of the channel region 118 of box C of FIG. 1A. The channel region 118 may include, for example, a first semiconductor material 130, a second semiconductor material 132 on a side of the first semiconductor material 130, and a third semiconductor material 134 on an opposing side of the second semiconductor material 132. The second semiconductor material 132 may be located between the first semiconductor material 130 and the third semiconductor material 134. The channel region 118 of FIG. 1C may also be referred to herein as a so-called "multilayer" channel region, since the channel region 118 includes more than one semiconductor material (e.g., the first semiconductor material 130, the second semiconductor material 132, and the third semiconductor material 134).

The first semiconductor material 130, the second semiconductor material 132, and the third semiconductor material 134 may each be independently selected from zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($ZnxO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), indium tungsten oxide (IWO), or combinations thereof.

In some embodiments, the first semiconductor material 130 and the third semiconductor material 134 comprise the same material and the second semiconductor material 132 comprises a different material than the first semiconductor material 130 and the third semiconductor material 134. In other embodiments, each of the first semiconductor material 130, the second semiconductor material 132, and the third semiconductor material 134 comprise different materials. In some embodiments, the first semiconductor material 130 and the third semiconductor material 134 comprise IGZO and the second semiconductor material 132 comprises IGSO such that the channel region 118 comprises an IGSO/IGZO/IGSO composite structure. Although FIG. 1C illustrates that the channel region 118 comprises three distinct semiconductor materials, the disclosure is not so limited. In other embodiments, the channel region 118 comprises two different semiconductor materials, four semiconductor materials, five semiconductor materials, etc. As one example, in some embodiments, the semiconductor structure channel region 118 comprises the first semiconductor material 130 and the second semiconductor material 132 adjacent to the first semiconductor material 130. The first semiconductor material 130 and the second semiconductor material 132 may comprise IGZO, but may have a different composition. For example, the first semiconductor material 130 may exhibit a different atomic percent of one or more of indium, gallium, and zirconium than the second semiconductor material 132. Stated another way, the second semiconductor material 132 may comprise the same elements as the first semiconductor material 130, but may exhibit a different stoichiometry (and composition) than the first semiconductor material 130.

Forming the channel region 118 as a composite structure may facilitate formation of a channel region 118 exhibiting one or more desired properties, such as, for example, hydrogen tolerance. In some embodiments, the hydrogen may not substantially diffuse into the channel region 118 and the channel region 118 may form a hydrogen barrier. As one example, a channel region 118 comprising an IGSO/IGZO/IGSO composite structure may exhibit tolerance to hydrogen and reduce or prevent diffusion of hydrogen into the composite structure, which hydrogen may otherwise diffuse into the channel region and negatively affect the electrical properties thereof.

With reference again to FIG. 1A and FIG. 1B, individual vertical transistors 110 may be separated from each other by the electrically insulative material 106. The electrically insulative material 106 may electrically isolate adjacent rows of the vertical transistors 110 and adjacent columns of the vertical transistors 110.

The electrically insulative material 106 may include, for example, phosphosilicate glass, borosilicate glass, borophosphosilicate glass (BPSG), fluorosilicate glass, silicon dioxide, titanium dioxide, a nitride material, (e.g., silicon nitride ($Si_3N_4$)), an oxynitride (e.g., silicon oxynitride), another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the electrically insulative material 106 comprises silicon dioxide. In some embodiments, the electrically insulative material 106 comprises the same material as the gate dielectric material 112.

A shielding material 120 may extend in lines in a direction (e.g., the y-direction in FIG. 1B) and may be disposed between adjacent vertical transistors 110 in a second direction (e.g., the x-direction in FIG. 1B). Accordingly, each vertical transistor 110 may include a shielding material 120 on a first side thereof and another shielding material 120 on a second, opposite side thereof. With reference to FIG. 1B, in some embodiments, the shielding material 120 may extend in lines along the semiconductor device 100 in a first direction, such as in the column direction. The shielding material 120 may be electrically isolated from the first conductive lines 104 by at least the electrically insulative material 124 and the electrically insulative material 106. The shielding material 120 may be electrically isolated from the second conductive lines 126 at least by the electrically insulative material 106. In addition, the shielding material 120 may be separated from the channel regions 118 at least by the electrically insulative material 106.

As will be described herein, the shielding material 120 may be formulated, configured, and electrically biased to reduce or prevent word line to word line capacitance between the gate electrodes 108 of adjacent vertical transistors 110. Accordingly, the shielding material 120 may be configured to reduce capacitance (e.g., word line capacitance) between the gate electrodes 108 of adjacent vertical transistors 110.

The shielding material 120 may have a thickness $T_4$ between about 20 Å and about 100 Å, such as between about 20 Å and about 40 Å, between about 40 Å and about 60 Å, between about 60 Å and about 80 Å, or between about 80 Å and about 100 Å.

A distance D between a lower surface of the shielding material 120 and a lower surface of the channel regions 118 may be between about 10 nm and about 50 nm, such as between about 10 nm and about 30 nm or between about 30 nm and about 50 nm. The distance D may be controlled by the thickness of the electrically insulative material 106.

The shielding material 120 may comprise an electrically conductive material. In some embodiments, the shielding material 120 comprises a material having a P+ type conductivity and may be referred to as a P+ body region. In other embodiments, the shielding material 120 comprises an electrically conductive metal, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. Suitable conductively-doped semiconductor materials may be doped with P-type dopants, such as boron, aluminum, gallium, or combinations thereof. In some embodiments, the shielding material 120 comprises tungsten. In other embodiments, the shielding material 120 comprises ruthenium. In some embodiments, the shielding material 120 comprises the same material as the first conductive lines 104 and/or the second conductive lines 126.

The shielding material 120 may be in electrical communication with an electrically conductive contact 122 (FIG. 1B), which may be configured to provide a suitable bias to the shielding material 120. In some embodiments, the electrically conductive contact 122 is in electrical communication with a voltage source configured to bias the electrically conductive contact 122 and the associated shielding material 120. The voltage source to which the electrically conductive contact 122 is in electrical communication may be different than a voltage source with which the electrically conductive contacts 122 and the gate electrodes 108 are in electrical communication with.

In some embodiments, the electrically conductive contact 122 comprises the same material as the shielding material 120. In other embodiments, the electrically conductive contact 122 comprises a material different from the material of the shielding material 120. The electrically conductive contacts 122 may comprise the same material as the electrically conductive contacts 109.

In some embodiments, the shielding material 120 may be configured to be biased to a predetermined voltage when a gate electrode 108 of at least one vertical transistor 110 adjacent to the shielding material 120 is selected (i.e., biased with a voltage). Without being bound by any particular theory, it is believed that when a switching voltage is applied to the gate electrodes 108, since the channel regions 118 are located outside (i.e., on sides) of the gate electrodes 108 (rather than the gate electrode 108 being disposed around the channel region 118), the channel regions 118 of one vertical transistor 110 may be influenced by the gate electrode 108 of an adjacent vertical transistor 110. In some embodiments, application of a suitable bias voltage to the shielding material 120 may prevent or reduce an effect of an applied voltage to the gate electrode 108 of a vertical transistor 110 on the channel region 118 of an adjacent vertical transistor 110. Accordingly, the shielding material 120 may facilitate reduction or prevention of a so-called "word line to word line capacitance" between the word lines 108 of adjacent vertical transistors 110. In some embodiments, a word line capacitance of the semiconductor device 100 may be about 35 percent less than a word line capacitance of a conventional semiconductor device not including the shielding material 120.

In use and operating, the shielding material 120 may be biased at a voltage between −2.0 V and about 2.0 V, such as between about −2.0 V and about −1.5 V, between about −1.5 V and about −1.0 V, between about −1.0 V and about −0.5 V, between about −0.5 V and about 0 V, between about 0 V and about 0.5 V, between about 0.5 V and about 1.0 V, between about 1.0 V and about 1.5 V, or between about 1.5 V and about 2.0 V. In some embodiments, the shielding material 120 is biased at a voltage between about 0 V and about 0.5 V. In some embodiments, such as where the shielding material 120 is configured to be biased, the shielding material 120 may be referred to as a so-called "back gate" of the semiconductor device 200.

In use and operation, a voltage may be applied to one or more word lines 108. In some embodiments, another voltage, which may be different (e.g., have a different magnitude) than the voltage applied to the one or more word lines 108, may be applied to the shielding material 120 located adjacent to the word line 108 to which the voltage is applied. Application of the another voltage to the shielding material 120 may reduce a word line to word line capacitance between word lines 108 of adjacent vertical transistors 110.

Accordingly, each vertical transistor 110 of the array of vertical transistors 110 may include a gate electrode 108, which may be located at a central portion of its respective vertical transistor 110. The gate electrode 108 may be surrounded by a gate dielectric material 112 on one or more sides thereof. The gate dielectric material 112 may be in contact with a channel region 118 on an opposite side of which the gate electrode 108 is in contact. In other words, the gate dielectric material 112 may be disposed between the gate electrode 108 and the channel region 118. The gate electrode 108 may include two channel regions 118 associated therewith. The channel regions 118 may comprise an oxide semiconductor material. In some embodiments, each gate electrode 108 may include two channel regions 118 associated therewith and may be located laterally between the two channel regions 118. Since the channel regions 118 are disposed on the outside of the centrally located gate electrodes 108, the gate electrodes 108 of each vertical transistor 110 may be formed to a larger thickness compared to conventional vertical transistors while the pitch of the vertical transistors 110 is the same as conventional vertical transistors. The larger thickness of the gate electrodes 108 increases the area thereof, and therefore, reduces the electrical resistance thereof. As a result, the RC (product of resistance and capacitance) of the vertical transistors 110 may be reduced, which may correlate to an increase in the switching speed of the vertical transistors 110. The vertical transistors 110 may deliver the same current (e.g., about 5 μA/Dev) as conventional vertical transistors arranged in the same pitch.

As will be described herein, in some embodiments, the channel regions 118 may be formed from a material that is unetched (e.g., not etched), or at least a portion of the channel regions 118 are unetched, following the formation thereof. Accordingly, the channel regions 118 may exhibit improved electrical properties compared to conventional channel materials that are exposed to various etch chemistries, such as hydrogen-containing plasmas. In some embodiments, the channel regions 118 may comprise a composite structure and hydrogen may not substantially diffuse into the channel regions 118. The vertical transistors 110 may exhibit a higher threshold voltage compared to conventional vertical transistors and may also exhibit a lower magnitude of off current $I_{off}$ compared to conventional vertical transistors. In some embodiments, the vertical transistors 110 may be in the off state with about 0 V applied to the gate electrode 108. In other words, a negative voltage may not be applied to the gate electrode 108 when the vertical transistors 110 are in the off state. In some embodiments, a bias voltage may be applied to the shielding material 120 while the vertical transistors 110 are in the off state. By way of contrast, conventional vertical transistors including channel materials comprising, for example, polysilicon, and not including the shielding material 120, may exhibit leakage current when the vertical transistors are in the off state if a substantial negative voltage is not applied to the gate electrode (e.g., an off voltage having a magnitude larger than about 1.0). In some embodiments, application of a voltage to a gate electrode 108 of one vertical transistor 110 may not affect the gate electrode 108 or the channel regions 118 of an adjacent vertical transistor 110.

Accordingly, in at least some embodiments, a semiconductor device comprises a first conductive line and a vertical transistor over the first conductive line. The vertical transistor comprises a gate electrode, a gate dielectric material overlying sides of the gate electrode, and a channel region on sides of the gate dielectric material, the gate dielectric material located between the channel region and the gate electrode. The semiconductor device further comprises a second conductive line overlying a conductive contact of the vertical transistor.

Accordingly, in at least some embodiments, a semiconductor device comprises a vertical over a first electrically conductive line, the vertical transistor comprising a gate electrode surrounded by a gate dielectric material, a first channel region on a first side of the gate electrode, the gate dielectric material located between the first channel region and the gate electrode, and a second channel region on a second side of the gate electrode, the gate dielectric material located between the second channel region and the gate electrode. The semiconductor device further comprises a second electrically conductive line over the vertical transistor, and an electrically conductive material between channel regions of adjacent vertical transistors, the electrically conductive material electrically isolated from the channel regions by an electrically insulative material.

Accordingly, in at least other embodiments, a semiconductor device comprises a vertical transistor comprising a gate electrode, a first channel region on a first side of the gate electrode, a second channel region on a second side of the gate electrode, the second side opposite the first side, and a gate dielectric between the first channel region and the gate electrode and between the second channel region and the gate electrode. The semiconductor device further comprises an electrically conductive material on the side of the first channel region and the second channel region, the electrically conductive material electrically isolated from the first channel region and the second channel region by an electrically insulative material.

Accordingly, in at least some embodiments, a method of operating a semiconductor device comprises applying a bias voltage to a gate electrode of a semiconductor device comprising a vertical transistor. The vertical transistor comprises a gate electrode, a gate dielectric material on at least opposing sides of the gate electrode, and a channel material on sides of the gate dielectric material, the gate electrode located between different portions of the channel material. The method further comprises applying another bias voltage to an electrically conductive material located between the transistor and at least another transistor of the semiconductor device.

In some embodiments, the semiconductor device 100 may include a stack of vertical transistors 110, such as in a 3D memory structure, such as in a stacked DRAM array. In some such embodiments, the semiconductor device 100 may include one or more decks of vertical transistors 110, each deck vertically offset from other decks of vertical transistors 110. Each deck of vertical transistors 110 may be isolated from each other by insulative materials extending therebetween. For example, with reference to FIG. 1A, an electrically insulative material may be formed over the second conductive lines 126. First electrically conductive lines 104 of another deck of vertical transistors 110 may be formed over the electrically insulative material and vertical transistors 110 may be formed over the first electrically conductive lines 104 of the another deck to form a structure comprising multiple decks (e.g., two decks, three decks, four decks, eight decks, etc.) of vertical transistors.

Figure 2A:
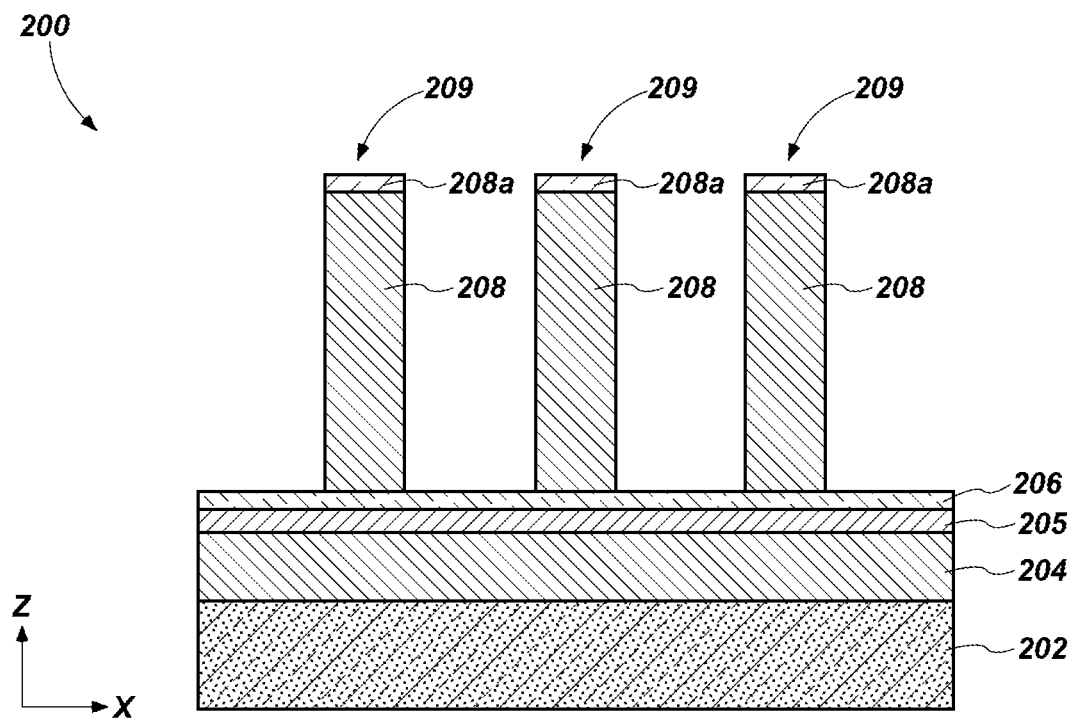
FIG. 2A through FIG. 2K illustrate a method of forming the semiconductor device, in accordance with embodiment of the disclosure.
Figure 2B:
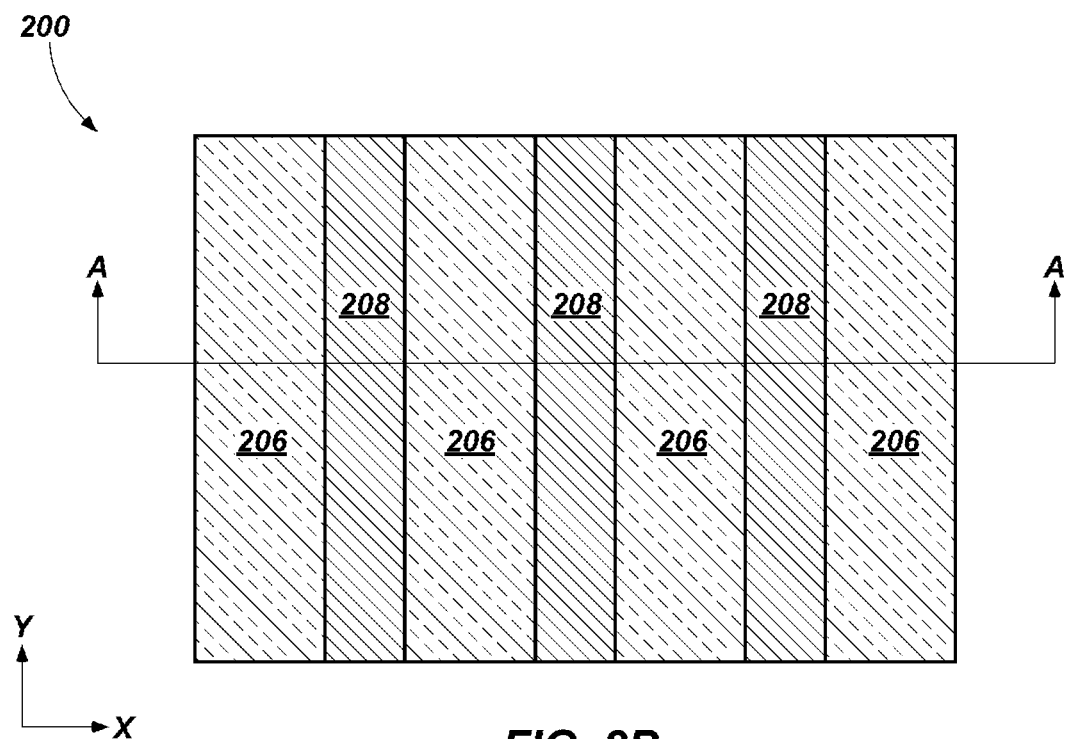
Figure 2C:
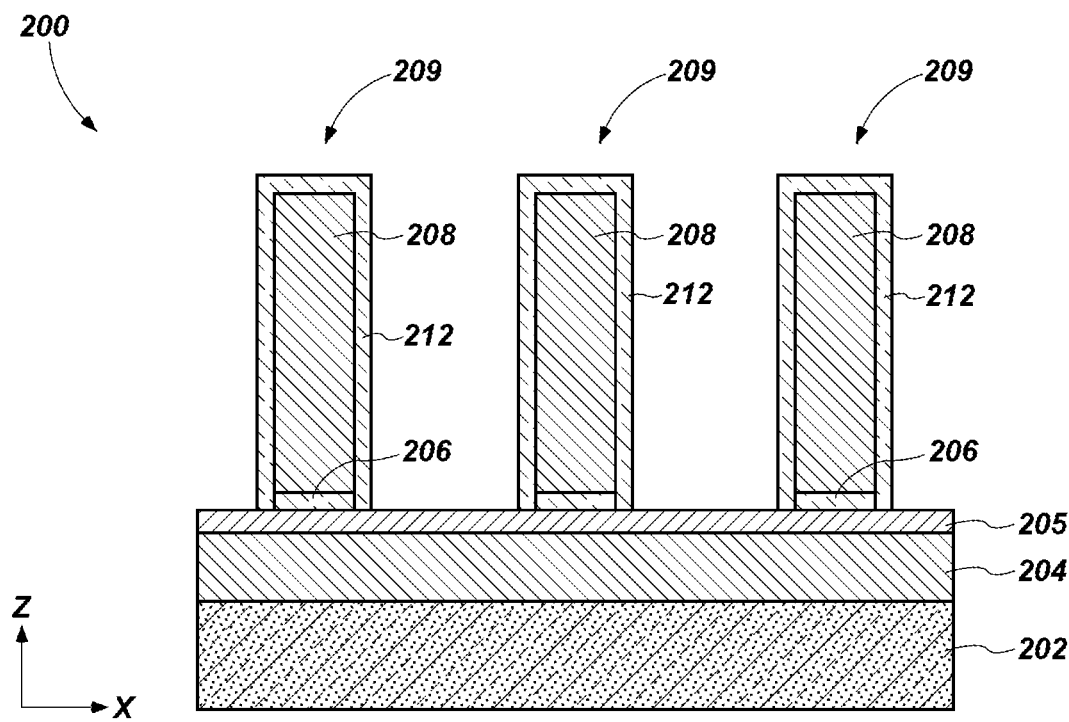
Figure 2D:
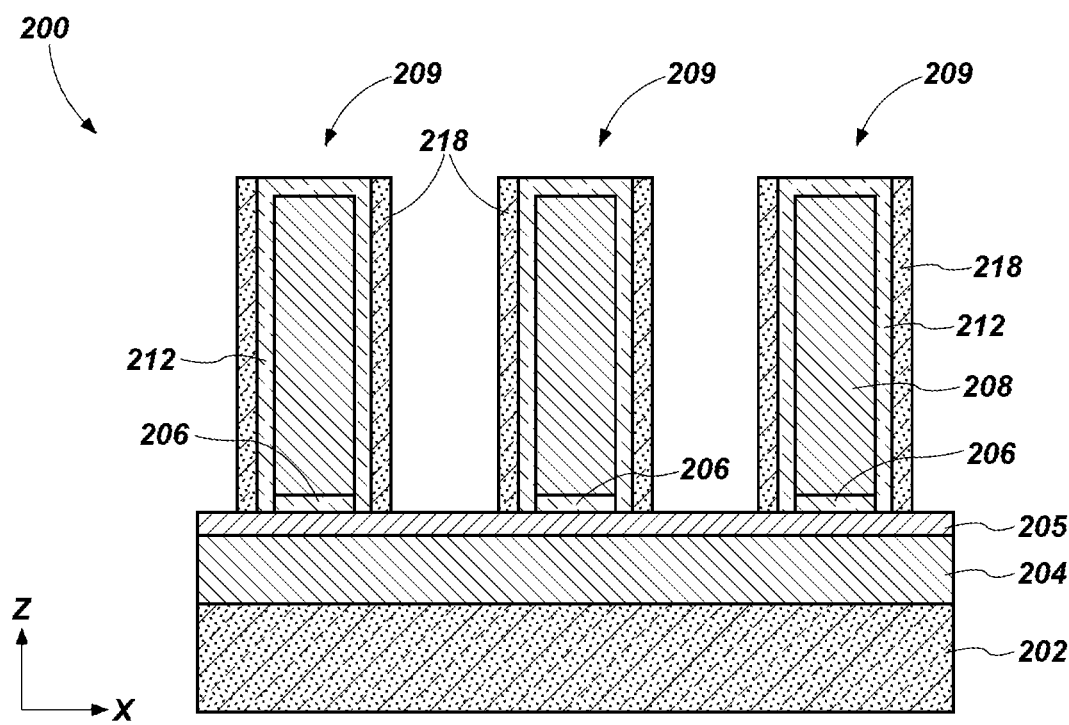
Figure 2E:
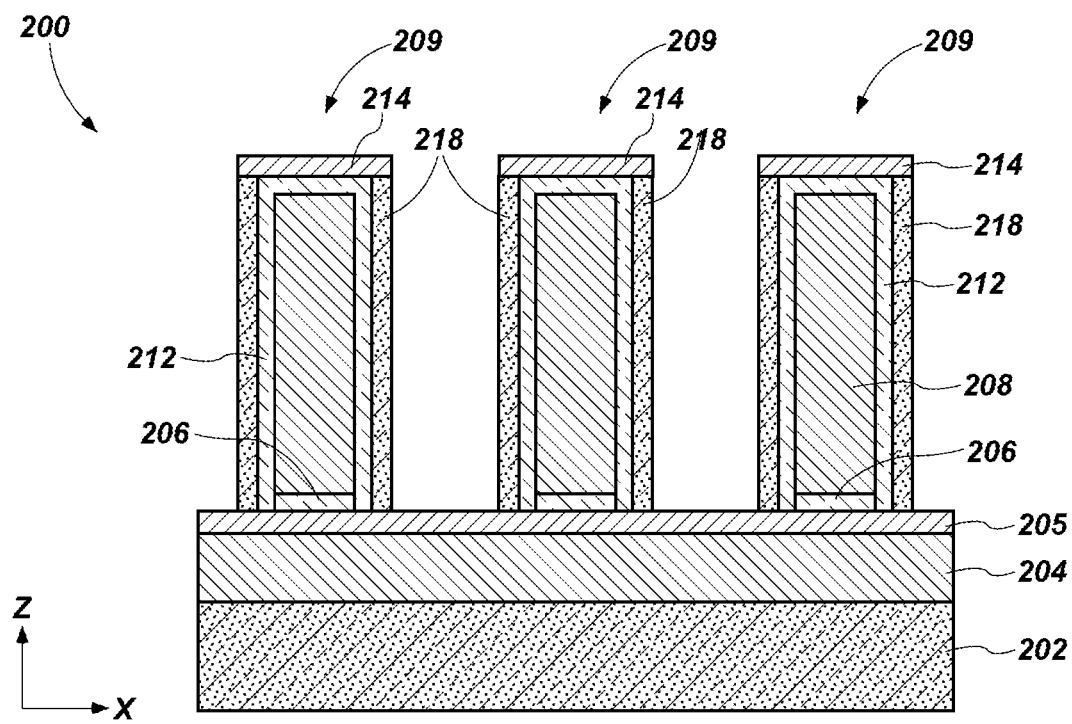
Figure 2F:
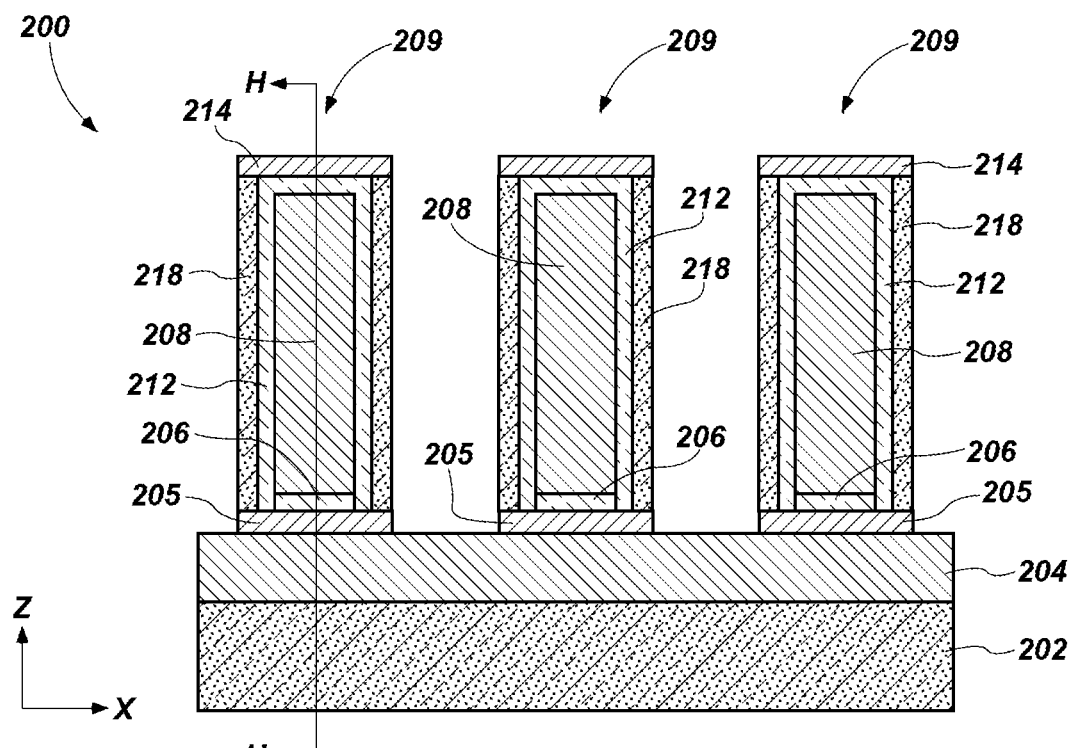
Figure 2G:
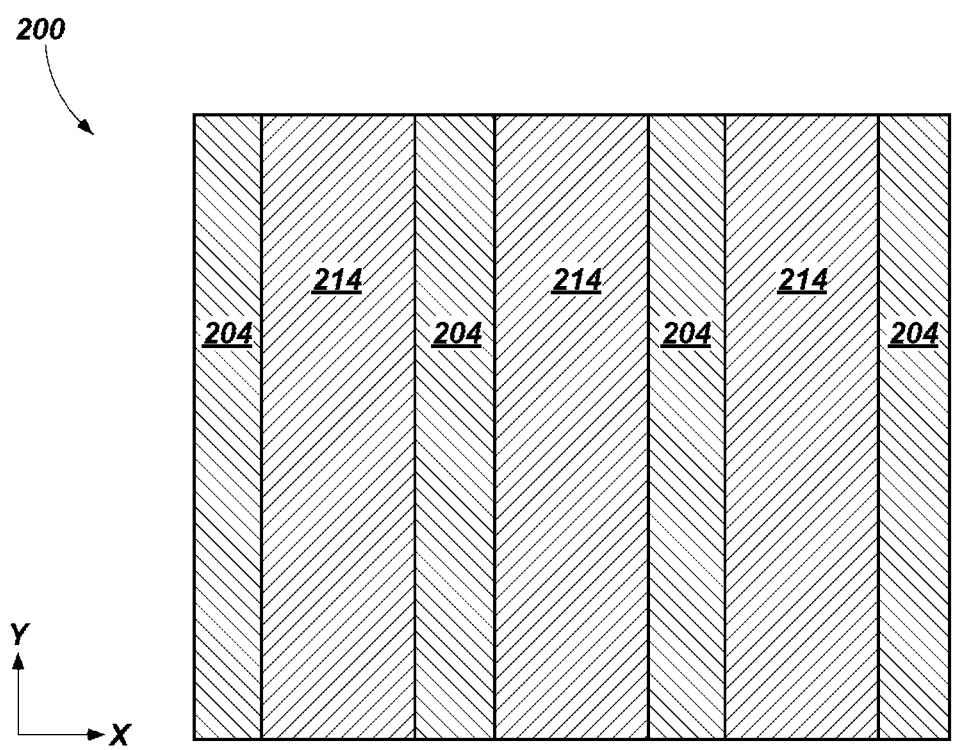
Figure 2H:
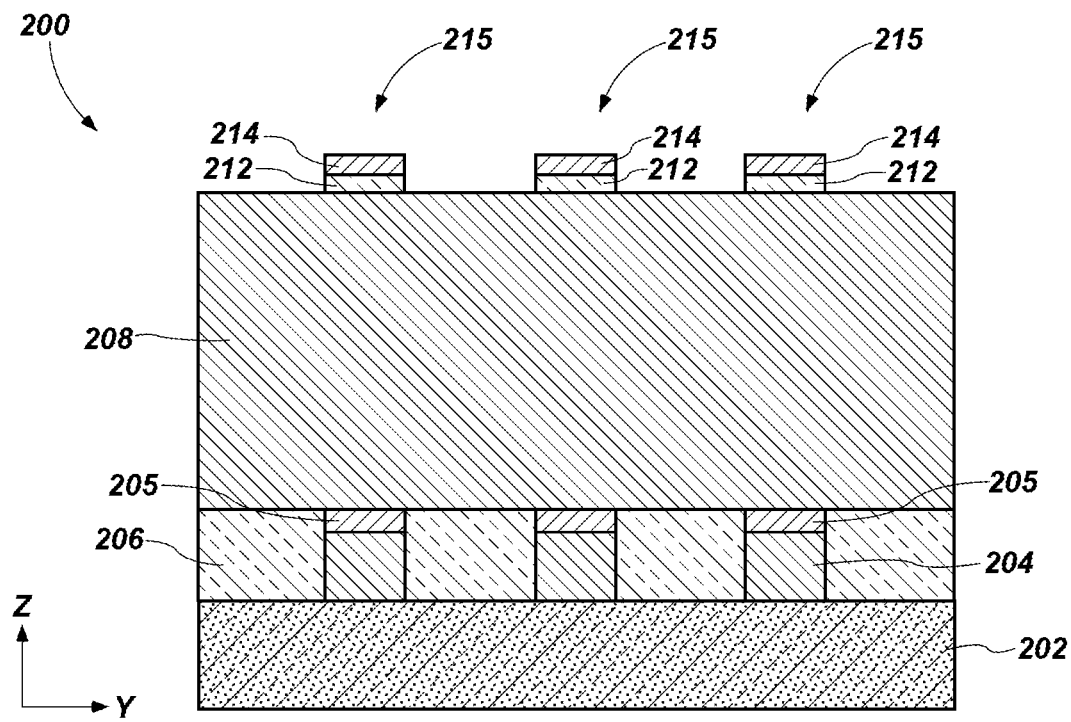

FIG. 2A through FIG. 2K illustrate a method of forming the semiconductor device 100 described above with reference to FIG. 1A through FIG. 1C, in accordance with some embodiments of the disclosure. FIG. 2A is a simplified perspective view of a semiconductor device 200 and FIG. 2B is a top view of the semiconductor device 200. The semiconductor device 200 may include a first electrically conductive material 204 over a substrate 202, a lower conductive contact material 205 over the first electrically conductive material 204, an electrically insulative material 206 over the lower conductive contact material 205, and lines 209 of a gate electrode material 208, which will eventually be patterned to form the gate electrodes 108 (FIG. 1A, FIG. 1B), as will be described herein. The first electrically conductive material 204 and the lower conductive contact material 205 may be patterned prior to forming the electrically insulative material 206 and the gate electrode material thereon. The first electrically conductive material 204 and the lower conductive contact material 205 may comprise lines extending in a first direction (e.g., the x-direction). In some embodiments, the electrically insulative material 206 is formed over the lower conductive contact material 205 after the first electrically conductive material 204 and the lower conductive contact material 205 are patterned. In some such embodiments, the electrically insulative material 206 may fill spaces between patterned portions (e.g., lines) of the first electrically conductive material 204 and the lower conductive contact material 205, as illustrated in the view of FIG. 2H.

The substrate 202 and the first electrically conductive material 204 may be substantially the same as the substrate 102 and the first conductive lines 104, respectively, described above with reference to FIG. 1A. The electrically insulative material 206 may be substantially the same as the gate dielectric material 112 described above with reference to FIG. 1A and FIG. 1B. The lower conductive contact material 205 may comprise the same materials described above with reference to the lower conductive contact 105.

The lines 209 of the gate electrode material 208 may be formed by forming the gate electrode material 208 over the electrically insulative material 206, forming a mask over portions of the gate electrode material 208, and exposing the portions of the gate electrode material 208 exposed through the mask to a suitable etchant to remove the exposed portions thereof and form the lines 209. The lines 209 of the gate electrode material 208 may extend in a first direction, such as in the y-direction. The gate electrode material 208 may comprise the same materials described above with reference to the gate electrodes 108 (FIG. 1A, FIG. 1B). In some embodiments, an upper portion of the gate electrode material 208 may include a dielectric material 208a. The dielectric material 208a may also be referred to herein as a hard mask. In some embodiments, the dielectric material 208a comprises silicon nitride. As will be described herein, the dielectric material 208a may substantially protect the gate electrode material 208 from etchants during patterning of vertical transistors. Although the dielectric material 208a is not illustrated in FIG. 2B through FIG. 2K, it will be understood that the dielectric material 208a may, in some embodiments, overlie the gate electrode material 208 and protect the gate electrode material 208 during subsequent etching acts, as described with reference to FIG. 2H.

With reference to FIG. 2C a gate dielectric material 212 may be formed adjacent to (e.g., over) the lines 209 of the gate electrode material 208. The gate dielectric material 212 may comprise the same materials described above with reference to the gate dielectric material 112 (FIG. 1A, FIG. 1B). In some embodiments, the gate dielectric material 212 comprises silicon dioxide. In some embodiments, the gate dielectric material 212 comprises the same material as the electrically insulative material 206. Accordingly, the electrically insulative material 206 and the gate dielectric material 212 may comprise a unitary insulative material, which may correspond to the gate dielectric material 112. Although FIG. 2C through FIG. 2K illustrate the electrically insulative material 206 and the gate dielectric material 212 as separate components, it will be understood that the electrically insulative material 206 and the gate dielectric material 212 may comprise a unitary structure exhibiting a substantially uniform composition (e.g., silicon dioxide).

The gate dielectric material 212 may be formed by, for example, atomic layer deposition (ALD), chemical vapor deposition (CVD), physical vapor deposition (PVD), low pressure chemical vapor deposition (LPCVD), plasma-enhanced chemical vapor deposition (PECVD), another deposition method, or combinations thereof. The gate dielectric material 212 may be formed conformally over the lines 209 of the gate electrode material 208. In some embodiments, the gate dielectric material 212 and the electrically insulative material 206 between adjacent lines 209 may be removed to expose portions of the lower conductive contact material 205 between the adjacent lines 209. In some embodiments, the gate dielectric material 212 and the electrically insulative material 206 between adjacent lines 209 are removed by exposing the gate dielectric material 212 and the electrically insulative material 206 between the adjacent lines 209 to a suitable etch chemistry, such as to a reactive ion etch chemistry formulated and configured to remove the gate dielectric material 212 and the electrically insulative material 206 without substantially removing the lower conductive contact material 205. In some embodiments, a mask may overlie the gate dielectric material 212 over the gate electrode material 208 such that the gate dielectric material 212 is not removed from over surfaces of the gate electrode material 208. Accordingly, the gate dielectric material 212 and the electrically insulative material 206 may substantially surround the gate electrode material 208.

Referring to FIG. 2D, a semiconductor material 218 may be formed (e.g., conformally formed) over the semiconductor device 200. The semiconductor material 218 may be formed over surfaces (e.g., sidewalls) of at least the gate dielectric material 212. The semiconductor material 218 may comprise the same materials described above with reference to the channel regions 118 (FIG. 1A). The semiconductor material 218 may be formed by ALD, CVD, PVD, LPCVD, PECVD, another deposition method, or combinations thereof. In some embodiments, the semiconductor material 218 is formed by atomic layer deposition. In some embodiments, the semiconductor material 218 is formed at a low temperature (e.g., between about 15° C. and about 25° C.). Since the semiconductor material 218 is formed over the lines 209 of the gate electrode material 208 and the gate dielectric material 212, the semiconductor material 218 may be patterned in at least the first direction. Accordingly, the semiconductor material 218 may not be etched to pattern the semiconductor material 218 in the first direction and may be formed as lines extending in a same direction as the gate electrode material 208. In other words, the semiconductor material 218 adjacent to and on surfaces of the gate dielectric material 212 may be arranged as lines without being exposed to etch chemistries used to pattern the semiconductor material 218 as lines (e.g., without exposing the semiconductor material 218 to hydrogen-containing plasmas). Stated another way, in some embodiments, the semiconductor material 218 may be deposited as patterned lines.

In some embodiments, the semiconductor material 218 may be formed as a composite structure, as described above with reference to FIG. 1C. In some embodiments, at least a first semiconductor material may be formed over surfaces of the semiconductor device 200 (such as by atomic layer deposition) and at least a second semiconductor material may be formed over the first semiconductor material (such as by atomic layer deposition). In some embodiments, additional semiconductor materials may be formed over the second semiconductor material to form a composite structure exhibiting desired electrical and material properties (e.g., threshold voltage, leakage current, hydrogen tolerance, etc.).

In some embodiments, portions of the semiconductor material 218 formed over the gate dielectric material 212 of the lines 209 and over the first electrically conductive material 204 may be removed such that the semiconductor material 218 overlies only portions (e.g., sidewalls) of the gate dielectric material 212 on sidewalls of the lines 209. In some embodiments, the semiconductor device 200 is exposed to a reactive ion etching plasma comprising, for example, $CHF_3$, $SF_6$, $C_4F_8$, $CH_3F$, another gas, or combinations thereof to remove the semiconductor material 218 from surfaces of the lower conductive contact material 205 between adjacent lines 209. In other embodiments, the semiconductor material 218 between the adjacent lines 209 is removed by exposing the semiconductor material 218 on surfaces of the lower conductive contact material 205 between the adjacent lines 209 to a wet etch chemistry. In some embodiments, an upper surface of the semiconductor material 218 may not be substantially coplanar with an upper surface of the gate electrode material 208. In some such embodiments, the upper surface of the semiconductor material 218 may be located farther from the substrate 202 than the upper surface of the gate electrode material 208. In some embodiments, the semiconductor material 218 on upper surfaces of the gate dielectric material 212 is removed by chemical mechanical planarization.

Referring to FIG. 2E, an upper conductive contact material 214 may be formed over surfaces of the lines 209, such as over the gate dielectric material 212 on upper surfaces of the lines 209. The upper conductive contact material 214 may include the same materials described above with reference to the upper conductive contact 114 (FIG. 1A).

In some embodiments, the upper conductive contact material 214 may be formed on the lines 209 by filling spaces between the lines with a sacrificial material (e.g., a photoresist, silicon, another material, etc.), forming a mask over the lines sacrificial material and exposing the lines 209 (i.e., the gate dielectric material 212) through the mask, forming the upper conductive contact material 214 through openings in the mask, and removing the mask and sacrificial material. In other embodiments, the upper conductive contact material 214 may be formed at a later stage of fabrication of the semiconductor device 200.

With reference to FIG. 2F, a portion of the lower conductive contact material 205 between adjacent lines 209 may be removed to expose the first electrically conductive material 204 between adjacent lines 209 and form discrete lower electrically conductive contacts (e.g., the lower conductive contacts 105 (FIG. 1A)), each lower electrically conductive contact associated with a respective line 209. Although FIG. 2F illustrates that the lower conductive contact material 205 between adjacent lines 209 been removed, the disclosure is not so limited and the lower conductive contact material 205 may be substantially coextensive with the first electrically conductive material 204.

FIG. 2G is a top view of the semiconductor device 200 after formation of the upper conductive contact material 214 and after removal of the lower conductive contact material 205 between adjacent lines 209.

Figure 2I:
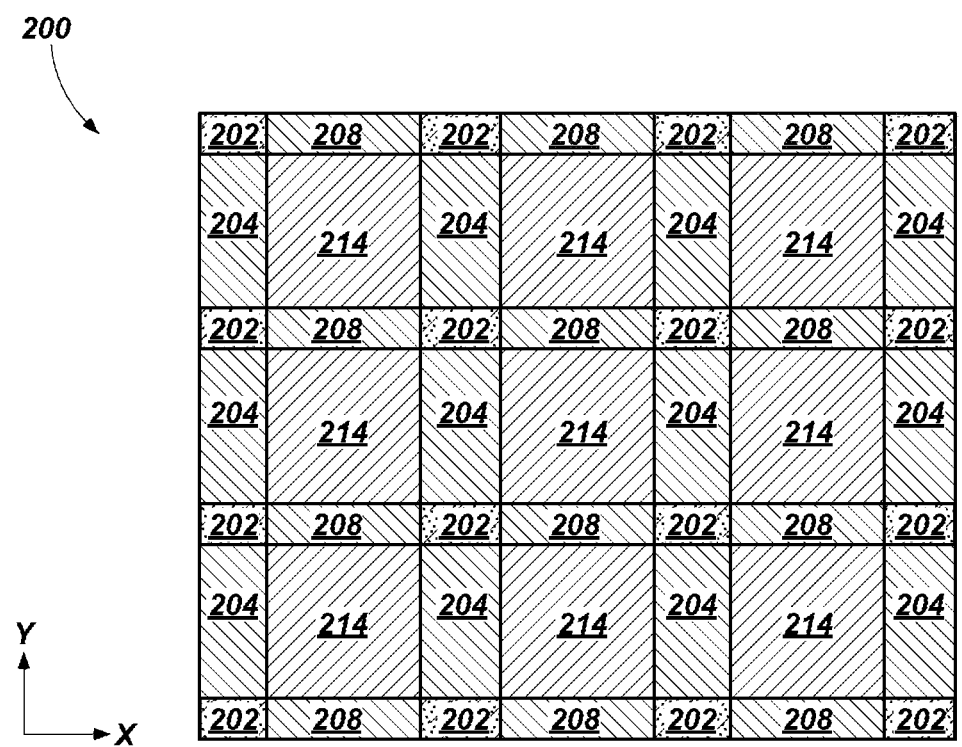

With reference to FIG. 2H and FIG. 2I, the semiconductor device 200 may be patterned in a second direction. FIG. 2H is a simplified cross-sectional view of the semiconductor device taken along section line H-H of FIG. 2F. In some embodiments, a mask or a resist material may be placed over the lines 209 in the first direction and the semiconductor device 200 may be patterned in the second direction. Portions of the upper conductive contact material 214, the gate dielectric material 212, and the semiconductor material 218 may be patterned to form transistor structures 215. In some embodiments, the gate electrode material 208 may not be removed while the portions of the upper conductive contact material 214 and the semiconductor material 218 may be patterned to form the transistor structures 215. For example, the dielectric material 208a (FIG. 2A) may protect the underlying gate electrode material 208 from various etchants during patterning of the semiconductor device 200 in the second direction. In some embodiments, the portions of the upper conductive contact material 214 and the semiconductor material 218 are removed by exposing the semiconductor material to a wet etch chemistry. Accordingly, in some embodiments, transistor structures 215 are formed and the semiconductor material 218 is patterned in the first direction and in the second direction without exposing the semiconductor material 218 to dry etchants, such as dry etchants comprising hydrogen. In other words, transistor structures 215 may be formed and patterned in the first direction and the second direction without etching the semiconductor material 218 in at least one of the first direction and the second direction and without exposing the semiconductor material 218 to dry etch chemistries.

After forming the transistor structures 215, spaces between adjacent transistor structures 215 are filled with an electrically insulative material, which may comprise the same materials described above with reference to the electrically insulative material 106.

Figure 2J:
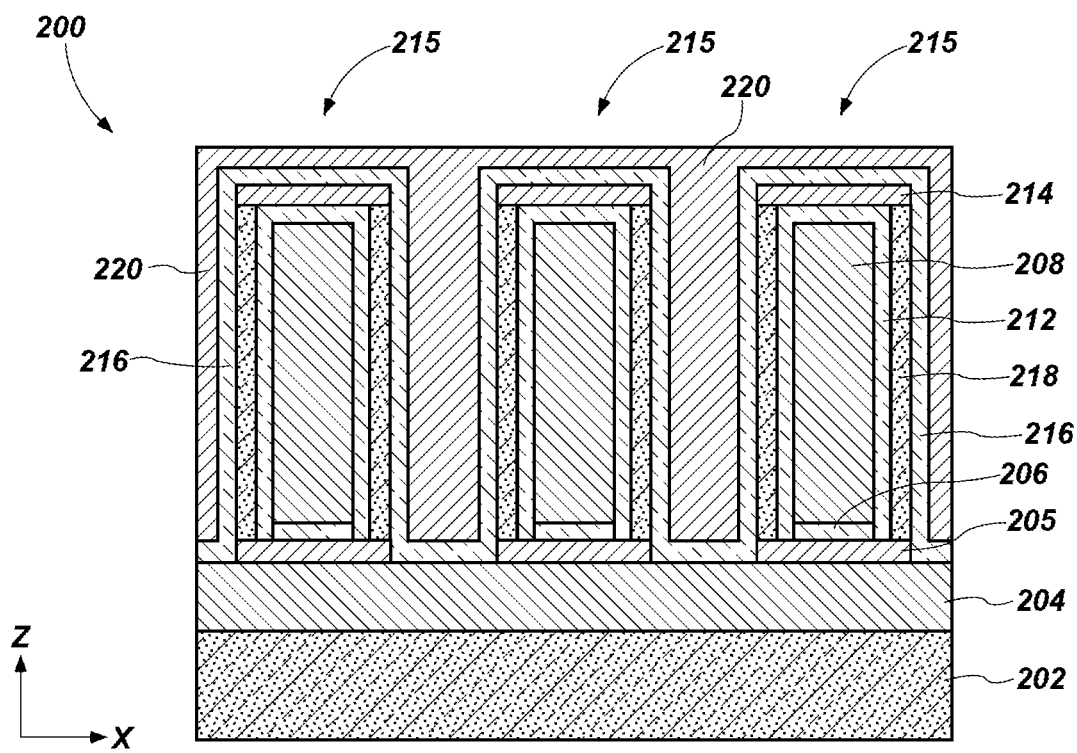

Referring to FIG. 2J, an electrically insulative material 216 may be formed (e.g., conformally formed) over the transistor structures 215. The electrically insulative material 216 may comprise the same materials described above with reference to the electrically insulative material 106 (FIG. 1A, FIG. 1B). The electrically insulative material 216 may be formed by, for example, ALD, CVD, PVD, LPCVD, PECVD, another deposition method, or combinations thereof.

After forming the electrically insulative material 216, an electrically conductive material 220 may be formed (e.g., conformally formed) over the electrically insulative material 216. In some embodiments, forming the electrically conductive material 220 substantially fills a volume between adjacent transistor structures 215. In other words, spaces between the electrically insulative material 216 of adjacent transistor structures 215 may be filled with the electrically conductive material 220.

The electrically conductive material 220 may comprise the same materials described above with reference to the shielding material 120 (FIG. 1A, FIG. 1B). In some embodiments, the electrically conductive material 220 comprises the same material as the gate electrode material 208.

Figure 2K:
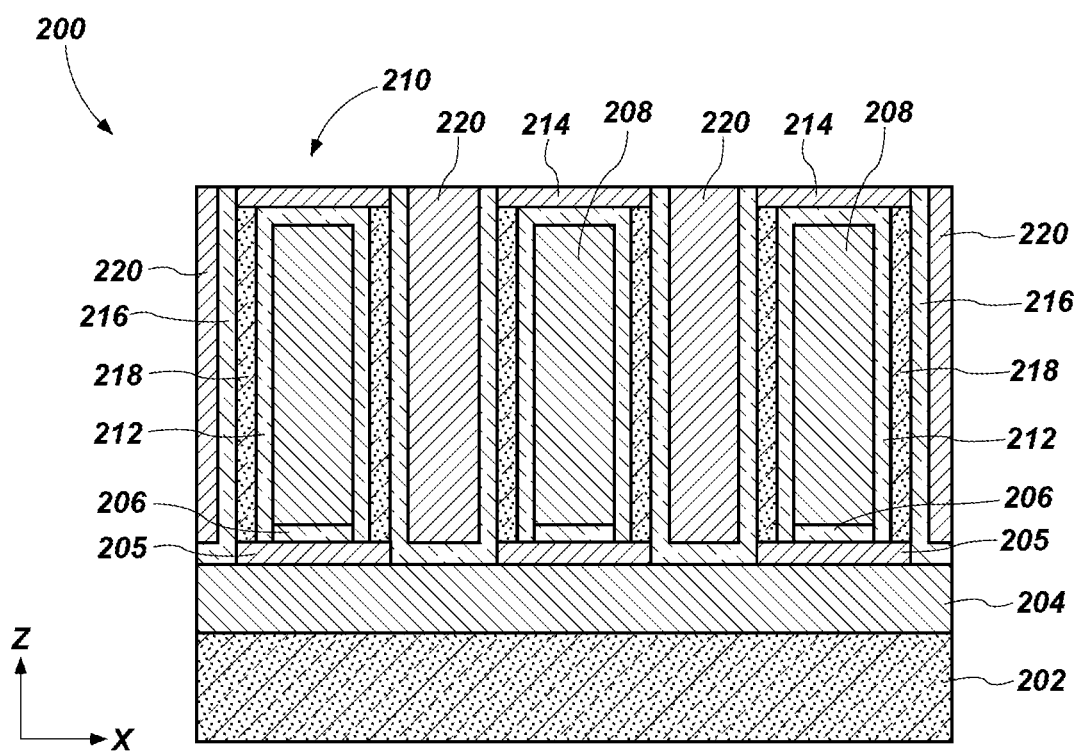

Referring to FIG. 2K, the electrically conductive material 220 and the electrically insulative material 216 over surfaces of the upper conductive contact material 214 may be removed to form a substantially planar upper surface of the semiconductor device 200 and expose portions of the upper conductive contact material 214.

After planarizing the semiconductor device 200, in some embodiments another electrically conductive material may be patterned over the upper conductive contact material 214 to form electrically conductive lines extending in the y-direction. In some embodiments, the electrically conductive lines may extend in a direction different from the direction in which the lines 209 of the first electrically conductive material 204 extend. In some embodiments, the electrically conductive lines may be referred to as a source line. In other embodiments, the electrically conductive lines may be referred to as a digit line, a bit line, or an access line.

Although FIG. 2A through FIG. 2K have been described as forming different components of the semiconductor device 200 in a particular order, the disclosure is not so limited. For example, although the upper conductive contact material 214 has been described as being formed after forming the semiconductor material 218, the disclosure is not so limited to the particular order of forming components of the semiconductor device 200. In other embodiments, the upper conductive contact material 214 may be formed after forming the electrically insulative material 216 and the electrically conductive material 220. In some such embodiments, the electrically conductive material 220 and the electrically insulative material 216 over the transistor structures 215 (FIG. 2J) may be removed from over surfaces of the transistor structures 215 to form openings in the electrically conductive material 220 and the electrically insulative material 216 and expose the upper portion of the gate dielectric material 212. The upper conductive contact material 214 may be formed in the openings. Thereafter, the upper conductive contact material 214, the electrically conductive material 220, and the electrically insulative material 216 may be removed from upper surfaces of the semiconductor device 200, such as by chemical mechanical planarization.

Accordingly, vertical transistors 210 may be formed of and include the semiconductor materials 218 located on sides of the gate electrode material 208. In some embodiments, the gate electrode material 208 of each vertical transistor 210 is located at a laterally central position of the vertical transistor and the semiconductor materials 218 are located adjacent to, such as on opposing sides (e.g., lateral sides), of the gate electrode material 208. A vertical length (i.e., in the z-direction) of the semiconductor material 218 may be larger than a vertical length of the gate electrode material 208. In some embodiments, the semiconductor material 218 may be formed and patterned without exposing the semiconductor material 218 to various etch chemistries, such as dry etch chemistries. For example, after forming the semiconductor material 218, the semiconductor material 218 that will form the channel regions 118 (FIG. 1A) (e.g., the semiconductor material 218 on the sidewalls of the gate dielectric material 212) may not be substantially exposed to dry etch chemistries. Accordingly, in some such embodiments, the semiconductor material 218 may be said to comprise a "pristine" or an "as-deposited" material and may exhibit improved electrical properties relative to channel regions of conventional vertical transistors.

In some embodiments, such as when the semiconductor material 218 is formed by atomic layer deposition, the semiconductor material 218 may be formed as a composite structure. In some such embodiments, the semiconductor material 218 may be formulated and configured to exhibit hydrogen tolerance (e.g., substantially reduce or prevent diffusion of hydrogen therein).

In some embodiments, after the semiconductor device 200 is formed, the semiconductor device 200 may be subject to a hydrogen anneal process, such as by exposing the semiconductor device 200 to a temperature of at least about 400° C., such as at least about 450° C., at least about 500° C., or at least about 600° C. During the hydrogen anneal process, the semiconductor material 218 may include a composite structure that may be formulated and configured to exhibit immunity to hydrogen and protected against permeation of hydrogen species into the semiconductor material 218.

Accordingly, in at least some embodiments, a method of forming a semiconductor device comprises forming a first conductive line and forming a vertical transistor over the first conductive line. Forming the vertical transistor comprises forming a gate electrode, forming a gate dielectric material adjacent to a first side of the gate electrode and adjacent to a second side of the gate electrode, and after forming the gate electrode, forming a channel region adjacent to the gate dielectric material adjacent to the first side of the gate electrode and adjacent to the gate dielectric material adjacent to the second side of the gate electrode. The method further comprises forming a second conductive line over the vertical transistor.

Accordingly, semiconductor devices (e.g., the semiconductor devices 100, 200) of the disclosure may be formed with pristine channel regions (e.g., channel regions 118, the semiconductor material 218 formed without etching the semiconductor material thereof). The channel regions 118, the semiconductor material 218 of the disclosure may exhibit improved properties relative to conventional semiconductor materials of conventional vertical transistors. For example, the channel regions 118, the semiconductor material 218 of the disclosure may exhibit a higher threshold voltage, a reduced off current, and a greater electron carrier mobility compared to conventional semiconductor materials. In addition, the channel regions 118, the semiconductor material 218 may exhibit a tolerance to hydrogen and may be formulated and configured to prevent hydrogen diffusion therein. The semiconductor devices 100, 200 may exhibit a reduced word line to word line capacitance relative to conventional semiconductor devices due at least in part to the shielding material 120, 220. In some embodiments, the semiconductor devices 100, 200 may exhibit an improved switching speed compared to conventional semiconductor devices.

Figure 3:
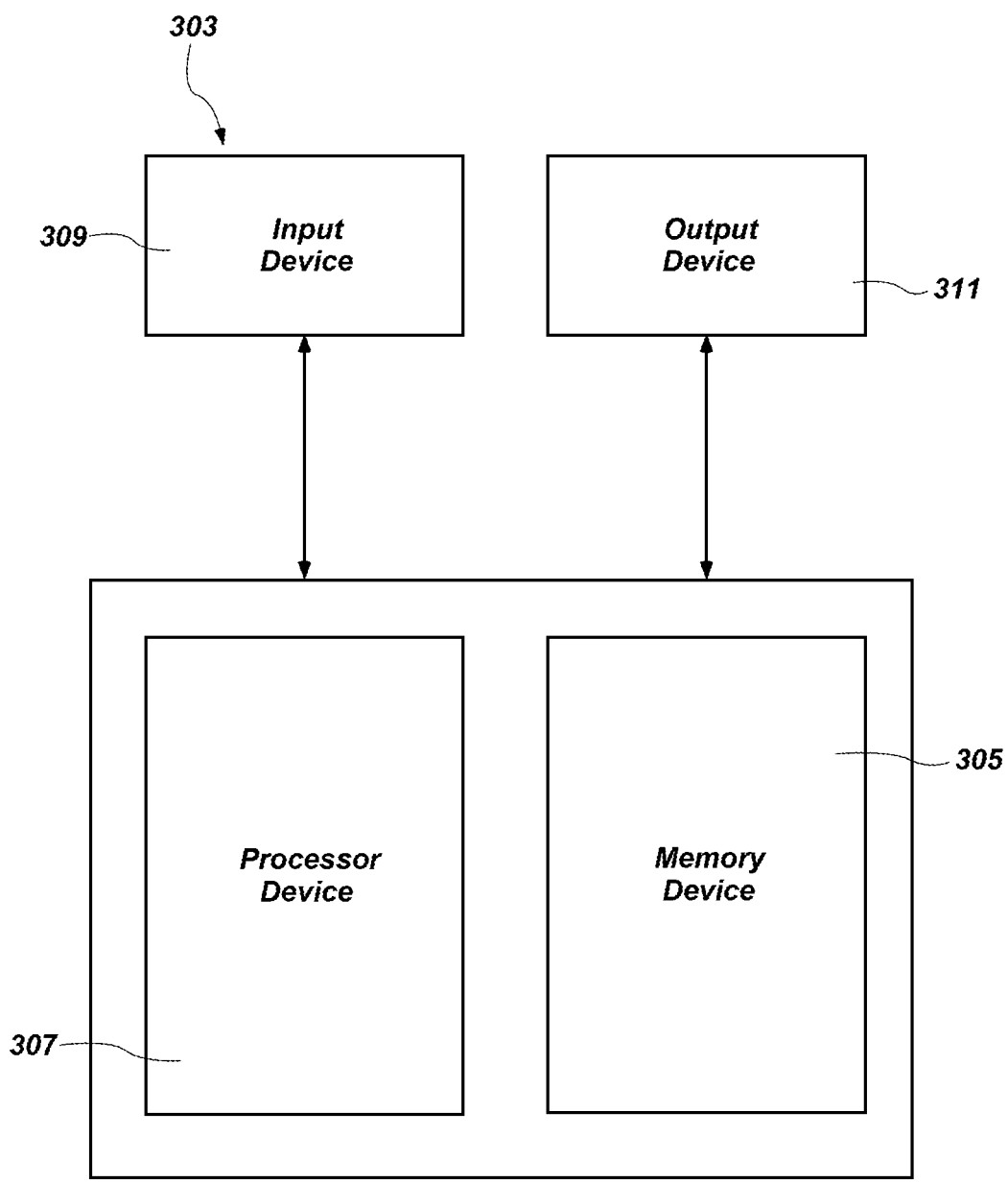
FIG. 3 is a schematic block diagram of an electronic system, in accordance with an embodiment of the disclosure.

Semiconductor devices (e.g., the semiconductor devices 100, 200) including the channel regions (e.g., the channel regions 118, the semiconductor material 218) in accordance with embodiments of the disclosure may be used in embodiments of electronic systems of the disclosure. For example, FIG. 3 is a block diagram of an illustrative electronic system 303 according to embodiments of disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a semiconductor device previously described herein (e.g., semiconductor devices 100, 200), wherein channel regions (e.g., the channel regions 118, the semiconductor material 218) comprise pristine as-deposited materials. The semiconductor device may include at least one gate electrode (e.g., the gate electrode material 108, 208) located centrally to channel regions (e.g., the channel regions 118, the semiconductor material 218). In addition, the semiconductor device may include a shielding material (e.g., the shielding material 120, 220) between adjacent vertical transistors (e.g., the vertical transistors 110, 210), which may reduce word line to word line capacitance of the semiconductor device.

The electronic system 303 may further include at least one electronic signal processor device 307 (often referred to as a "microprocessor"). The electronic signal processor device 307 may, optionally, include an embodiment of a semiconductor device previously described herein (e.g., the semiconductor devices 100, 200). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Thus, in accordance with embodiments of the disclosure, an electronic device comprises at least one input device, at least one output device, at least one processor device operably coupled to the at least one input device and the at least one output device, and a semiconductor device operably coupled to the at least one processor device. The semiconductor device comprises an array of vertical transistors. At least one vertical transistor of the array of vertical transistors comprises a gate electrode separated from a lower conductive contact by a gate dielectric material, the gate dielectric material overlying sidewalls of the gate electrode, a first channel region on a lateral side of the gate dielectric material, and a second channel region on a lateral side of the gate dielectric material opposite the lateral side of the first channel region, the gate electrode located between the first channel region and the second channel region.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A device, comprising:
    a first conductive line;
    a vertical transistor over the first conductive line, the vertical transistor comprising:
        a gate electrode;
        a gate dielectric material overlying sides of the gate electrode; and
        a channel region having a bandgap larger than a bandgap of silicon and on sides of the gate dielectric material, the gate dielectric material located between the channel region and the gate electrode, the channel region comprising a composite structure comprising:
            a first semiconductor material;
            a second semiconductor material; and
            a third semiconductor material, the second semiconductor material between the first semiconductor material and the third semiconductor material; and
    a second conductive line overlying a conductive contact of the vertical transistor.

2. The device of claim 1, wherein the channel region comprises two distinct channel regions, one of the distinct channel regions located on a first lateral side of the gate electrode and the other of the distinct channel regions located on a second lateral side of the gate electrode.

3. The device of claim 1, wherein the gate electrode is substantially surrounded on all sides thereof by the gate dielectric material.

4. The device of claim 1, wherein each of the first semiconductor material, the second semiconductor material, and the third semiconductor material independently comprises an oxide semiconductor material.

5. The device of claim 1, wherein each of the first semiconductor material, the second semiconductor material, and the third semiconductor material independently comprises at least one of ZTO, IZO, $ZnO_x$, IGZO, IGSO, $InO_x$, $In_2O_3$, $SnO_2$, $TiO_x$, $Zn_xO_yN_z$, $Mg_xZn_yO_z$, $In_xZn_yO_z$, $In_x$-$Ga_yZn_zO_a$, $Zr_xIn_yZn_zO_a$, $Hf_xIn_yZn_zO_a$, $Sn_xIn_yZn_zO_a$, $Al_xSn_y$-$In_zZn_aO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$, InGaSiO, or IWO.

6. The device of claim 1, wherein the second semiconductor material comprises an indium gallium zinc oxide material and each of the first semiconductor material and the third semiconductor material independently comprises an indium gallium silicon oxide material.

7. The device of claim 1, wherein each of the first semiconductor material, the second semiconductor material, and the third semiconductor material independently comprises a different material composition.

8. The device of claim 1, further comprising another electrically conductive material between adjacent vertical transistors, the another electrically conductive material electrically isolated from the channel regions of adjacent vertical transistors by an electrically insulative material.

9. The device of claim 8, wherein the another electrically conductive material is in electrical communication with a voltage source separate from the gate electrode and the first conductive line.

10. The device of claim 1, wherein the channel region is formed by atomic layer deposition.

11. A method of forming a device, the method comprising:
    forming a first conductive line;
    forming a vertical transistor over the first conductive line, forming the vertical transistor comprising:
        forming a gate electrode extending in a direction;
        forming a gate dielectric material adjacent to a first side of the gate electrode and adjacent to a second side of the gate electrode; and
        after forming the gate electrode, forming a channel region adjacent to the gate dielectric material adjacent to the first side of the gate electrode and adjacent to the gate dielectric material adjacent to the second side of the gate electrode, forming the channel region comprising:
            forming a channel material having a bandgap greater than a bandgap of silicon;

forming a composite structure comprising a second semiconductor material between a first semiconductor material and a third semiconductor material; and forming a second conductive line over the vertical transistor.

12. The method of claim 11, further comprising removing portions of the channel region to form another vertical transistor adjacent the vertical transistor.

13. The method of claim 11, wherein forming a channel material having a bandgap greater than a bandgap of silicon comprises forming the composite structure to exhibit a barrier to hydrogen diffusion.

14. The method of claim 11, wherein forming a composite structure comprises:
    forming the first semiconductor material comprising indium gallium silicon oxide;
    forming the second semiconductor material comprising indium gallium zinc oxide; and
    forming the third semiconductor material comprising indium gallium silicon oxide.

15. The method of claim 11, further comprising forming an electrically conductive material on a side of the channel region and separated from the channel region by an electrically insulative material.

16. The method of claim 11, wherein forming a channel region comprises forming the channel region by atomic layer deposition.

17. The method of claim 11, wherein forming a channel region comprises forming the channel region without exposing the channel region to a dry etchant.

18. A device, comprising:
    a vertical transistor, comprising:
        a gate electrode;
        a first channel region on a first side of the gate electrode;
        a second channel region on a second side of the gate electrode, the second side opposite the first side, the first channel region and the second channel region individually comprising a composite structure comprising at least two semiconductor materials; and
        a gate dielectric between the first channel region and the gate electrode and between the second channel region and the gate electrode; and
    an electrically conductive material on a side of the first channel region and the second channel region, the electrically conductive material electrically isolated from the first channel region and the second channel region by an electrically insulative material.

19. The device of claim 18, wherein the first channel region and the second channel region comprise an oxide semiconductor material.

20. The device of claim 18, wherein the gate electrode is located centrally between the first channel region and the second channel region.

21. The device of claim 18, wherein the vertical transistor is located vertically between first electrically conductive lines and second electrically conductive lines.

22. The device of claim 21, further comprising vertical transistors located above the first electrically conductive lines and the second electrically conductive lines.

23. The device of claim 21, wherein the electrically conductive material comprises lines extending in a same direction as one of the first electrically conductive lines and the second electrically conductive lines.

24. The device of claim 18, wherein an upper portion of the electrically conductive material is not coplanar with an upper portion of the gate electrode.

25. The device of claim 18, wherein the composite structure of each of the first channel region and the second channel region individually comprises indium gallium zinc oxide and indium gallium silicon oxide on sides of the indium gallium zinc oxide.

26. A method of operating a device, the method comprising:
    applying a bias voltage to a gate electrode of a device comprising a vertical transistor, the vertical transistor between a first conductive line and a second conductive line overlying the vertical transistor, the vertical transistor comprising:
        a gate electrode;
        a gate dielectric material on at least opposing sides of the gate electrode;
        a channel region comprising a channel material on sides of the gate dielectric material, the gate electrode located between different portions of the channel material, the channel material having a bandgap larger than a bandgap of silicon and comprising:
            a first semiconductor material;
            a second semiconductor material; and
            a third semiconductor material, the second semiconductor material between the first semiconductor material and the third semiconductor material; and
        a conductive contact overlying the gate electrode and contacting the second conductive line; and
    applying another bias voltage to an electrically conductive material located between the transistor and at least another transistor of the device.

27. The method of claim 26, wherein applying another bias voltage to an electrically conductive material comprises applying, to the electrically conductive material, another bias voltage having a different magnitude than the bias voltage applied to the gate electrode.

28. The method of claim 26, wherein applying another bias voltage to an electrically conductive material comprises applying a bias voltage between about −2.0 V and about 2.0 V to the electrically conductive material while applying the bias voltage to the gate electrode.

29. The method of claim 26, wherein applying a bias voltage to the gate electrode comprises applying a bias voltage of about 0 V to the gate electrode when the vertical transistor is in an off state.

30. The method of claim 29, wherein applying another bias voltage to an electrically conductive material comprises applying the another bias voltage to the electrically conductive material while applying the bias voltage of about 0 V to the gate electrode.

31. An electronic device, comprising:
    at least one input device;
    at least one output device;
    at least one processor device operably coupled to the at least one input device and the at least one output device; and
    a device operably coupled to the at least one processor device, the device comprising:
        a first conductive line; and
        an array of vertical transistors, at least one vertical transistor of the array of vertical transistors comprising:

a gate electrode separated from a lower conductive contact by a gate dielectric material, the gate dielectric material overlying sidewalls of the gate electrode;

a channel region having a bandgap larger than a bandgap of silicon and on sides of the gate dielectric material, the gate dielectric material located between the channel region and the gate electrode, the channel region comprising a composite structure comprising:

a first semiconductor material;

a second semiconductor material; and a third semiconductor material, the second semiconductor material between the first semiconductor material and the third semiconductor material; and a second conductive line overlying a conductive contact of the at least one vertical transistor.

* * * * *

UNITED STATES PATENT AND TRADEMARK OFFICE
CERTIFICATE OF CORRECTION

PATENT NO. : 11,139,396 B2  
APPLICATION NO. : 16/596090  
DATED : October 5, 2021  
INVENTOR(S) : Kamal M. Karda, Durai Vishak Nirmal Ramaswamy and Haitao Liu It is certified that error appears in the above-identified patent and that said Letters Patent is hereby corrected as shown below:

In the Specification  
Column 5, Line 41, change "BP SG" to --BPSG--

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*